(12) United States Patent
Pao et al.

(10) Patent No.: US 12,707,621 B2
(45) Date of Patent: Aug. 11, 2026

(54) MEMORY DEVICE WITH ALTERNATING METAL LINES

(71) Applicant: Taiwan Semiconductor Manufacturing Company, Ltd., Hsin-Chu (TW)

(72) Inventors: Chia-Hao Pao, Kaohsiung City (TW); Kian-Long Lim, Hsinchu City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 730 days.

(21) Appl. No.: 18/184,380

(22) Filed: Mar. 15, 2023

(65) Prior Publication Data

US 2024/0172409 A1 May 23, 2024

Related U.S. Application Data

(60) Provisional application No. 63/384,533, filed on Nov. 21, 2022.

(51) Int. Cl.
*H10B 10/00* (2023.01)
*H10B 80/00* (2026.01)
(Continued)

(52) U.S. Cl.
CPC ........... *H10B 10/125* (2023.02); *H10B 80/00* (2023.02); *H10W 20/20* (2026.01); *H10W 20/42* (2026.01); *H10W 20/435* (2026.01); *H10W 90/00* (2026.01)

(58) Field of Classification Search
CPC ...... H10B 10/12; H10B 10/125; H10B 80/00; H10B 10/00; H01L 23/5226;
(Continued)

(56) References Cited

U.S. PATENT DOCUMENTS 11,088,151 B2 * 8/2021 Fujiwara ................ G11C 5/063
11,158,634 B1 10/2021 Huang et al.
(Continued)

FOREIGN PATENT DOCUMENTS

TW 201801292 A 1/2018
TW 202145536 A 12/2021
(Continued)

*Primary Examiner* — John M Parker
(74) *Attorney, Agent, or Firm* — HAYNES AND BOONE, LLP

(57) ABSTRACT

One aspect of the present disclosure pertains to a memory device. The device includes a substrate having a first region and a second region adjacent the first region. A first SRAM cell is disposed within the first region, the first SRAM cell having first active regions extending lengthwise along a first direction on the substrate. A second SRAM cell is disposed within the second region, the second SRAM cell having second active regions extending lengthwise along the first direction on the substrate. Frontside metal lines are disposed over the first and second active regions, the frontside metal lines including a first bit line and a first bit line bar within the first region. And backside metal lines are under the first and second active regions, the backside metal lines having a second bit line and a second bit line bar within the second region.

20 Claims, 11 Drawing Sheets

(51) Int. Cl.

| | |
|---|---|
| ***H10W 20/20*** | (2026.01) |
| ***H10W 20/41*** | (2026.01) |
| ***H10W 20/42*** | (2026.01) |
| ***H10W 90/00*** | (2026.01) |

(58) Field of Classification Search

CPC ... H01L 23/528; H01L 23/5283; H01L 25/16; H10W 20/20; H10W 20/42; H10W 20/43; H10W 20/435

See application file for complete search history.

(56) References Cited

U.S. PATENT DOCUMENTS

| | | | | |
|---|---|---|---|---|
| 11,222,892 | B2 | 1/2022 | Su et al. | |
| 11,411,100 | B2 | 8/2022 | Wang et al. | |
| 11,532,627 | B2 | 12/2022 | Liao et al. | |
| 2012/0120703 | A1 * | 5/2012 | Chang | G11C 11/412 365/51 |
| 2015/0113492 | A1 | 4/2015 | Lin et al. | |
| 2019/0147928 | A1 * | 5/2019 | Liaw | H10D 89/10 365/155 |
| 2020/0083232 | A1 | 3/2020 | Huang et al. | |
| 2020/0381440 | A1 | 12/2020 | Jin | |
| 2021/0202385 | A1 * | 7/2021 | Huang | H10D 84/038 |
| 2021/0343332 | A1 * | 11/2021 | Chiu | H10B 10/12 |
| 2021/0376093 | A1 | 12/2021 | Chu et al. | |
| 2021/0399099 | A1 | 12/2021 | Chu et al. | |
| 2023/0005936 | A1 * | 1/2023 | Han | G11C 7/18 |
| 2023/0207648 | A1 * | 6/2023 | Huang | H10D 64/518 257/288 |
| 2024/0064950 | A1 * | 2/2024 | Chen | H10B 10/12 |
| 2024/0155822 | A1 * | 5/2024 | Anderson | H10D 89/10 |

FOREIGN PATENT DOCUMENTS

| | | |
|---|---|---|
| TW | 202207228 A | 2/2022 |
| TW | 202209637 A | 3/2022 |

* cited by examiner

Fig. 8

902
A'
104b
120
bl1
blb1
104a
116
x
y
z
A

Legend
106
108
110
112
114
bl2
blb2
120
118

-z

1002
A'
104b
120
bl2
blb2
blb1
104a
bl1
116
A
x
y
z

Legend
106
108
110
112
114
120
118
-z

MEMORY DEVICE WITH ALTERNATING METAL LINES

PRIORITY

This application claims priority to U.S. Provisional Patent Application Ser. No. 63/384,533 filed Nov. 21, 2022, the entire disclosure of which is hereby incorporated herein by reference.

BACKGROUND

In deep sub-micron integrated circuit technology, embedded static random access memory (SRAM) devices have become a popular storage unit for high speed communication, image processing, and system-on-chip (SOC) products. The amount of embedded SRAM in microprocessors and SOCs increases to meet the performance requirement in each new technology generation. As silicon technology continues to scale from one generation to the next, parasitic effects may be impacting SRAM device performance more and more. For example, parasitic resistance and parasitic capacitance may become greater factors as semiconductor feature sizes continue to shrink. These parasitic effects may degrade the minimum operating voltage (Vmin) and the speed of an SRAM cell, which may lead to sub-par SRAM performance or even device failures.

Therefore, although existing SRAM devices have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. It is also emphasized that the drawings appended illustrate only typical embodiments of this invention and are therefore not to be considered limiting in scope, for the invention may apply equally well to other embodiments.

FIG. 8 illustrates a device layout showing frontside metal lines of a semiconductor device having an SRAM array.

DETAILED DESCRIPTION

Figure 1:
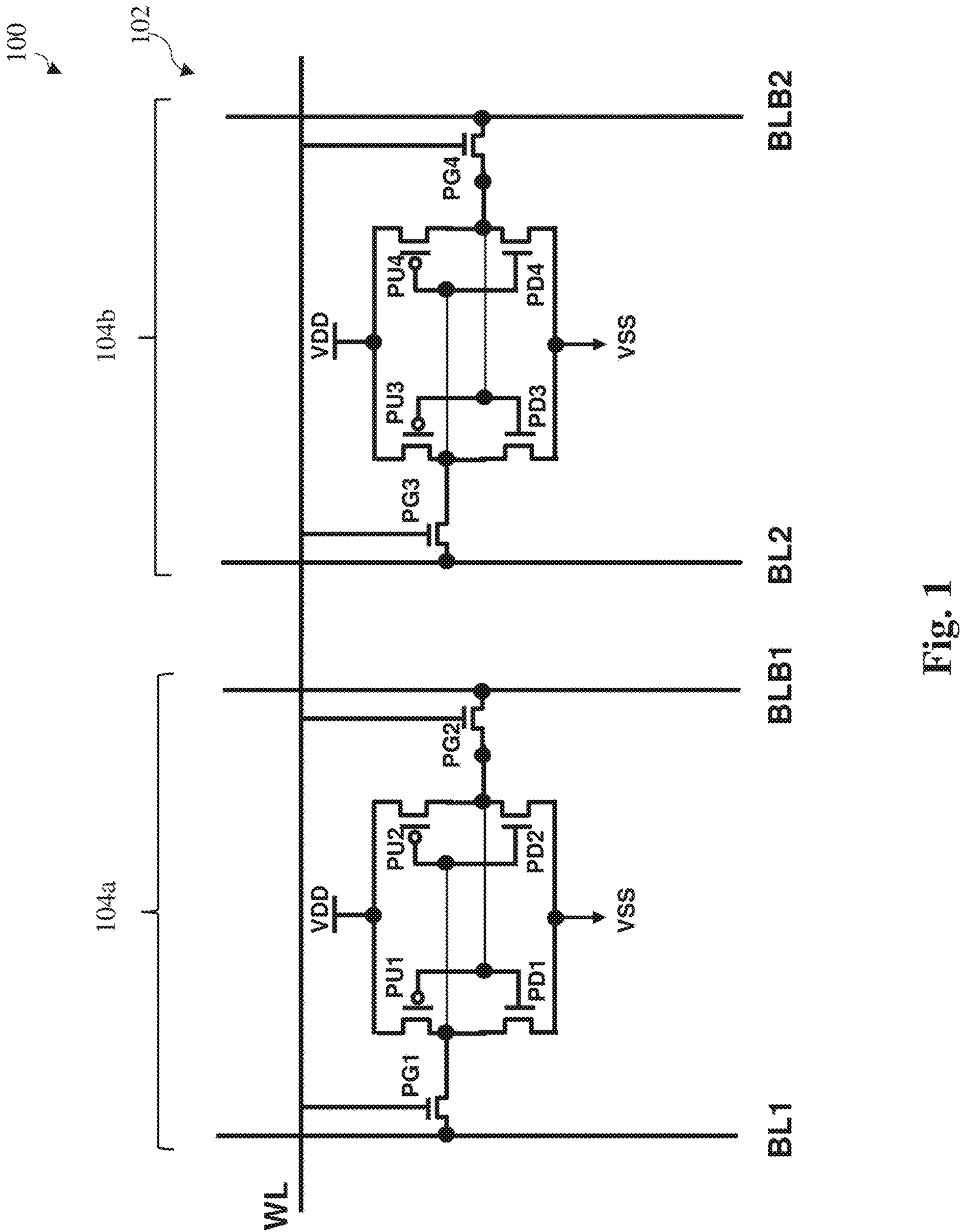
FIG. 1 illustrates a circuit diagram of a semiconductor device having an SRAM array according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Still further, when a number or a range of numbers is described with “about,” “approximate,” and the like, the term is intended to encompass numbers that are within a reasonable range including the number described, such as within +/−10% of the number described, or other values as understood by person skilled in the art. For example, the term “about 5 nm” may encompass the dimension range from 4.5 nm to 5.5 nm.

The present disclosure relates to semiconductor devices having optimized metal line routing. Particularly, the present disclosure is directed to semiconductor devices having static random access memory (SRAM) cells where adjacent SRAM cells in a semiconductor device have different metal line configurations. SRAM is a type of semiconductor memory that uses bi-stable latching circuitry (e.g., flip-flop) to store binary bits of information. A semiconductor device may include an SRAM array comprising a plurality of SRAM cells, each cell having a plurality of metal routing lines including signal lines such as bit lines and bit line bars (which are the logical opposite of bit lines). As device footprint continues to scale down, the spacing between metal lines becomes constrained, thereby adversely affecting device performance. For example, if metal lines for adjacent bit lines are too close to each other, the increased parasitic capacitance will degrade the speed of the device. And if the dimensions of the metal lines are reduced to decrease capacitance, there would be increased resistance, which would also degrade device operation. The present disclosure presents a new metal line routing scheme to alleviate the spacing and metal line dimension issues described above. Specifically, the locations of the bit lines and bit line bars from one SRAM cell to the next SRAM cell are alternated between being on a front side and being on a back side of a substrate. Further, word lines and ground lines on the front side of the substrate are shifted away at an offset from the bit lines and bit line bars on the front side of the substrate. This shift is possible due to the extra spacing created by moving some of the bit lines and bit line bars onto the backside of the substrate. These features reduce the coupling capacitance between signal lines (bit lines and bit line bars) of adjacent SRAM cells, while allowing frontside metal lines to be further spaced apart to further reduce coupling and allow more relaxed processing margins.

Embodiments of the present disclosure can be implemented with planar, FinFET, or gate-all-around (GAA) transistors. GAA transistors refer to transistors having gate stacks (gate electrodes and gate dielectric layers) surrounding transistor channels, such as vertically-stacked gate-all-around horizontal nanowire or nanosheet MOSFET devices. Those of ordinary skill in the art should appreciate that they may readily use the present disclosure as a basis for designing or modifying other structures for carrying out the same purposes and/or achieving the same advantages of the embodiments introduced herein.

FIG. 1 illustrates a circuit diagram of a semiconductor device 100 having an SRAM array 102 according to an embodiment of the present disclosure. The SRAM array 102 includes two SRAM cells 104*a* and 104*b*. Each of the two SRAM cells is formed of six transistors (two pull-down transistors, two pull-up transistors, and two pass-gate transistors). Each SRAM cell stores a bit of memory through the pull-down and pull-up transistors, and the SRAM cells are addressed by word lines and bit lines through the pass-gate transistors. The SRAM device 100 shows two SRAM cells in the SRAM array 102, but the SRAM device 100 may include additional SRAM cells coupled to the two SRAM cells 104*a* and 104*b* in a cascaded fashion. For example, another SRAM cell 104*b*' may be coupled to the left of the SRAM cell 104*a* and another SRAM cell 104*a*' may be coupled to the right of the SRAM cell 104*b* (See FIG. 7 for example device layout). In this case, the same word line node WL is shared among the four SRAM cells, but the bit lines and bit line bars are different. Further, additional SRAM cells may also couple to the top and to the bottom of the SRAM cells 104*a* and 104*b* (not shown). In this case, the same bit lines and bit line bars (e.g., BL1 and BLB1) are shared among SRAM cells in the same column (up and down), but the word lines are different.

The SRAM cell 104*a* includes pull-up transistors PU1 and PU2, pull-down transistors PD1 and PD2, and pass gate transistors PG1 and PG2. The sources of PU1 and PU2 are coupled together and connected to high voltage VDD. The sources of PD1 and PD2 are coupled together and connected to low source voltage VSS or ground. The gates of PU1 and PD1 are coupled together and connected to the common drains of PU2, PD2 and PG2. The gates of PU2 and PD2 are coupled together and connected to the common drains of PU1, PD1, and PG1. PU1, PU2, PD1, and PD2 form a first set of cross coupled inverters to store a data bit. The source of PG1 is connected to a first bit line BL1 and the source of PG2 is connected to a first bit line bar BLB1. The gates of PG1 and PG2 are connected to a word line node WL.

The SRAM cell 104*b* includes pull-up transistors PU3 and PU4, pull-down transistors PD3 and PD4, and pass gate transistors PG3 and PG4. The sources of PU3 and PU4 are coupled together and connected to high voltage VDD. The sources of PD3 and PD4 are coupled together and connected to low voltage VSS or ground. The gates of PU3 and PD3 are coupled together and connected to the common drains of PU4, PD4 and PG4. The gates of PU4 and PD4 are coupled together and connected to the common drains of PU3, PD3, and PG3. PU3, PU4, PD3, and PD4 form a second set of cross coupled inverters to store a data bit. The source of PG3 is connected to a second bit line BL2 and the source of PG4 is connected to a second bit line bar BLB2. The gates of PG3 and PG4 are connected to the same word line node WL.

Figures 2A, 2B:
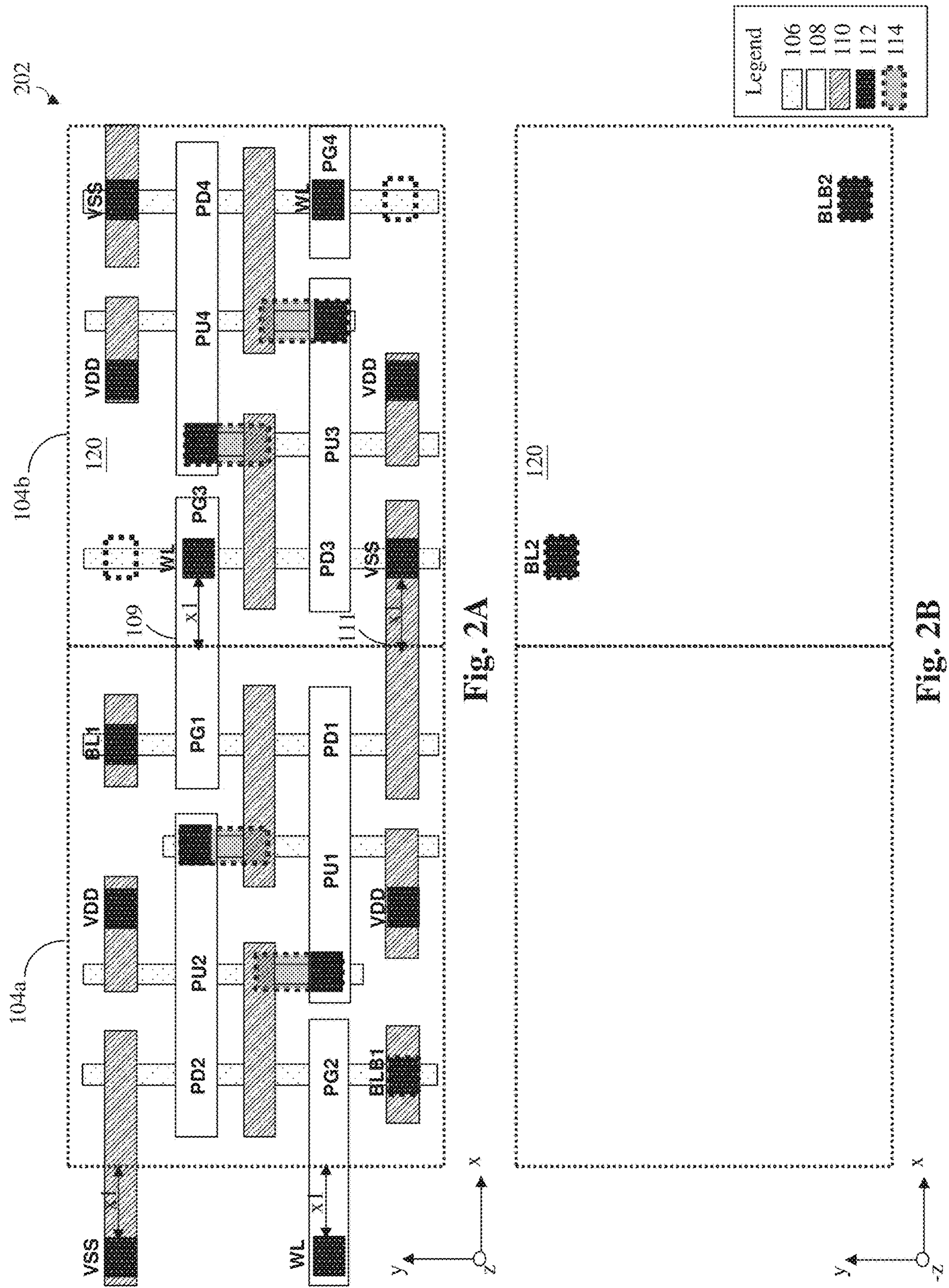
FIGS. 2A and 2B illustrate a device layout of the SRAM array in FIG. 1 according to an embodiment of the present disclosure.

FIGS. 2A and 2B illustrate a device layout 202 of the SRAM array 102 according to an embodiment of the present disclosure. The device layout 202 includes the SRAM cells 104*a*, and 104*b* defined by the dashed line cell boundaries, which defines separate regions on a substrate 120. The SRAM cells 104*a* and 104*b* are adjacent to each other in the x direction and mirror each other across a vertical cell boundary between them. As shown, many features are disposed upon the substrate 120. FIG. 2A depicts features on a front side of the substrate 120 and FIG. 2B depicts features on a back side of the substrate 120.

FIG. 2A shows where each of the transistors PU1, PU2, PU3, PU4, PD1, PD2, PD3, PD4, PG1, PG2, PG3, and PG4 are located (labeled on the gate of each transistor). How each transistor is connected to each other has already been described with respect to FIG. 1 and will not be repeated here for the sake of brevity.

The device layout 202 includes several active regions 106 extending in the y direction on a front side of the substrate 120. The active regions 106 may be configured for planar, fin, or gate-all-around semiconductor structures. In some embodiments, some of the active regions 106 may extend in the y direction across the upper or lower horizontal cell boundaries (not shown). These active regions would span across multiple SRAM cells oriented along the y direction. As shown in FIG. 2A, each of the active regions 106 have about the same dimensions (e.g., along the x direction, or widthwise direction). Further, along the x direction, each active region 106 is used by only one transistor. Therefore, along the x direction, a single active region 106 provides for a single channel for a transistor. A channel (or transistor channel) refers to a portion of the active region 106 directly under a gate 108. In this case, the channel length for each of the pull-up, pull-down, and pass-gate transistors would be substantially the same.

Several gates 108 are disposed over the active regions 106. The gates 108 extend lengthwise in the x direction. Some of the gates 108 may extend across the vertical cell boundaries of the SRAM cells 104*a* and 104*b*, thereby spanning across and engaging active regions 106 of different SRAM cells. Several source/drain (S/D) contacts 110 are disposed over S/D regions of the active regions 106, some of which may couple S/D regions of different transistors together. S/D region(s) may refer to a source or a drain, individually or collectively dependent upon the context. Several vias 112 are each coupled to one of the gates 108, the active regions 106, or the S/D contacts 110. These vias 112 allow the gates 108, the active regions 106, or the S/D contacts 110 to electrically couple to a higher or lower material layer in the z direction. In FIGS. 2A and 2B, each via 112 is labeled with the name of the node for which the respective via is a part thereof. For example, vias 112 as part of the word line node WL are labeled with “WL” to their sides. In an embodiment, vias 112 as part of WL, VSS, VDD, BL1, and BLB1 are located on a front side of the semiconductor device 100 (or on the front side of the substrate 120), and vias 112 as part of BL2 and BLB2 are located on a back side of the semiconductor device 100 (or on a back side of the substrate 120).

There are also four gate-to-drain contacts 114 that couple gates 108 to S/D contacts 110. The gate-to-drain contacts 114 are also referred to as butted contacts. In an embodiment, the interconnection between the drain (or source) to the gate is achieved by a local interconnect (LI) technology. For example, the local interconnect is formed using the gate electrode material, such as polysilicon, metal, or other conductive material used in gate electrode. In this situation, the polysilicon (metal, or other conductive material) is used not only to form gate electrode but also to form interconnect. More particularly, the gate electrode is extended to the targeted drain (or source) region and directly lands on the targeted drain (or source) region. In another example, the butted contacts 114 are elongated contacts oriented in the y direction and are formed simultaneously with other contacts (such as long contacts) in a same procedure that includes dielectric deposition, patterning and metal deposition.

Still referring to FIGS. 2A and 2B, the vias 112 for WL and VSS are distanced away from the vertical cell boundaries at an offset x1. Each of the vias 112 for WL and VSS land on a shared feature that spans across adjacent cells. For example, a via 112 for WL (WL via) may land on a shared gate 109. The shared gate 109 lands in regions within both SRAM cells 104*a* and 104*b*. The shared gate 109 may couple to the pass-gate transistor PG1 of SRAM cell 104*a* and to the pass-gate transistor PG3 of SRAM cell 104*b*. Specifically, the shared gate 109 engages active regions 106 of the transistors PG1 and PG3, forming channel regions in the active regions 106 underneath the shared gate 109. Although the shared gate 109 spans across SRAM cells 104*a* and 104*b*, the WL via only lands within the SRAM cell 104*b*. For example, the WL via is at a distance x1 away from the vertical cell boundaries, such that the WL via is directly above the active region 106 for the pass-gate transistor PG3 when viewed along the z direction. For another example, a via 112 for VSS (VSS via) may land on a shared S/D contact 111. The shared S/D contact 111 lands in regions within both SRAM cells 104*a* and 104*b*. The shared S/D contact 111 may couple to the pull-down transistor PD1 of SRAM cell 104*a* and to the pull-down transistor PD3 of SRAM cell 104*b*. Specifically, the shared S/D contact 111 couples together source regions of the active regions 106 for the transistors PD1 and PD3. Although the shared S/D contact 111 spans across SRAM cells 104*a* and 104*b*, the VSS via only lands within the SRAM cell 104*b*. For example, the VSS via is at a distance x1 away from the vertical cell boundaries, such that the VSS via is directly above the active region 106 for the pull-down transistor PD3 when viewed along the z direction.

Still referring to FIGS. 2A and 2B, the vias 112 for BL2 and BLB2 land on the back side of their respective active regions 106. These vias are shown in FIG. 2B and positionally correspond to the small dashed squares in FIG. 2A. In an embodiment, the vias 112 for BL2 and BLB2 may align or substantially align with the vias for WL and/or VSS along the y direction. In another embodiment, even if there is no substantial alignment, at least a portion of the vias 112 for BL2 and BLB2 will overlap with the vias for WL and/or VSS along the y direction. On the other hand, the vias 112 for BL1 and BLB1 land on the front side of their respective active regions 106, and they do not align or overlap with the vias for WL and/or VSS along the y direction.

Figures 3A, 3B:
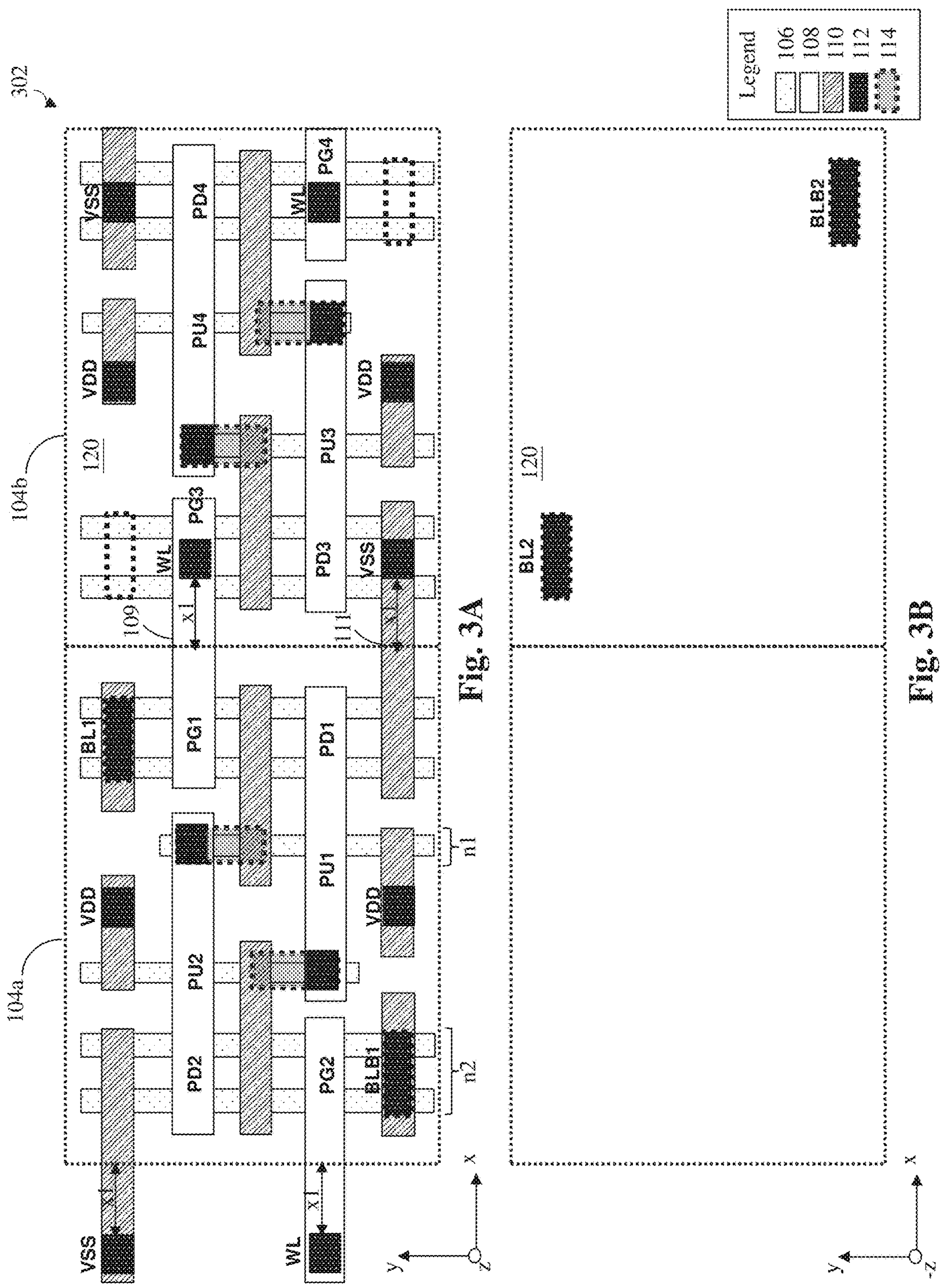
FIGS. 3A and 3B illustrates another device layout of the SRAM array in FIG. 1 according to an embodiment of the present disclosure.

FIGS. 3A and 3B illustrates another device layout 302 of the SRAM array 102 in FIG. 1 according to an embodiment of the present disclosure. The device layout 302 is similar to the device layout 202, and the description of similar features will not be repeated here for the sake of brevity. In device layout 302, multiple active regions 106 placed next to each other may be used for a single transistor channel for channel tuning considerations. For example, the active regions 106 for pull-down and pass-gate transistors may have a configuration n2 and the active regions 106 for pull-up transistors may have a configuration n1, where n1 and n2 are integers. In the embodiment shown, the n2 configuration includes two active regions and the n1 configuration includes one active region. However, other configurations are possible. For example, any integer number for n1 and n2 may be possible if it is within a design range. In an embodiment, the design range balances spacing with performance requirements such that a ratio between n2 to n1 is in a range between 1 to 4. In this case, the effective channel length for the pass-gate and pull-down transistors could be greater than the effective channel length for the pull-up transistors. The effective channel lengths of different transistors may be tuned differently to optimize operations related to cell stability, sink current, and access speed.

Still referring to FIGS. 3A and 3B, in some embodiments, the width of the vias 112 may vary, depending on if the vias 112 are landing on transistors having n1 versus n2 configurations. For example, the vias 112 for BL2 and BLB2 may be wider than the vias for VSS and WL due to having more landing area.

Figures 4A, 4B:
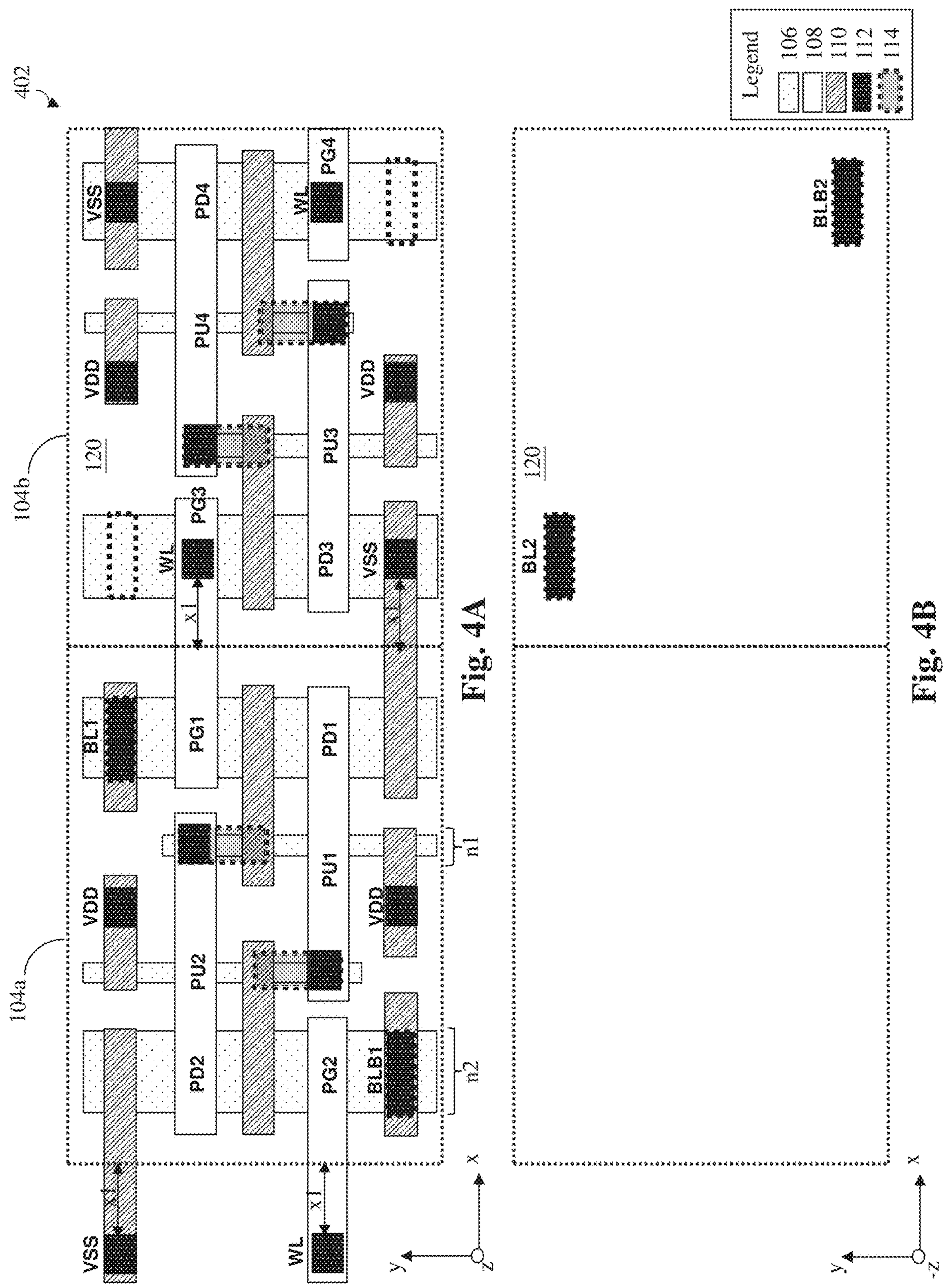
FIGS. 4A and 4B illustrates another device layout of the SRAM array in FIG. 1 according to an embodiment of the present disclosure.

FIGS. 4A and 4B illustrates another device layout 402 of the SRAM array 102 in FIG. 1 according to an embodiment of the present disclosure. The device layout 402 is similar to the device layout 202, and the description of similar features will not be repeated here for the sake of brevity. In device layout 402, some of the active regions 106 may have different dimensions (e.g., along the x direction, or the widthwise direction) from other active regions 106 due to channel tuning considerations. For example, as shown, the active regions 106 for the pull-down and pass-gate transistors may be wider than the active regions for the pull-up transistors along the x direction. The narrower active regions are labeled as having an n1 configuration and the wider active regions are labeled as having an n2 configuration, mirroring the n1 and n2 configurations described with respect to FIGS. 3A and 3B. In this case, n1 and n2 may each refer to a width of the active region it pertains to. Any width for n1 and n2 may be possible if it is within a design range. In an embodiment, the design range balances spacing with performance requirements such that a ratio between n2 to n1 is in a range between 1 to 4. In this case, the channel length for the pass-gate and pull-down transistors could be greater than the channel length for the pull-up transistors. The channel lengths of different transistors may be tuned differently to optimize operations related to cell stability, sink current, and access speed.

Still referring to FIGS. 4A and 4B, in some embodiments, the width of the vias 112 may vary, depending on if the vias 112 are landing on transistors having n1 versus n2 configurations. For example, the vias 112 for BL2 and BLB2 may be wider than the vias for VSS and WL due to having more landing area.

Figures 5A, 5B:
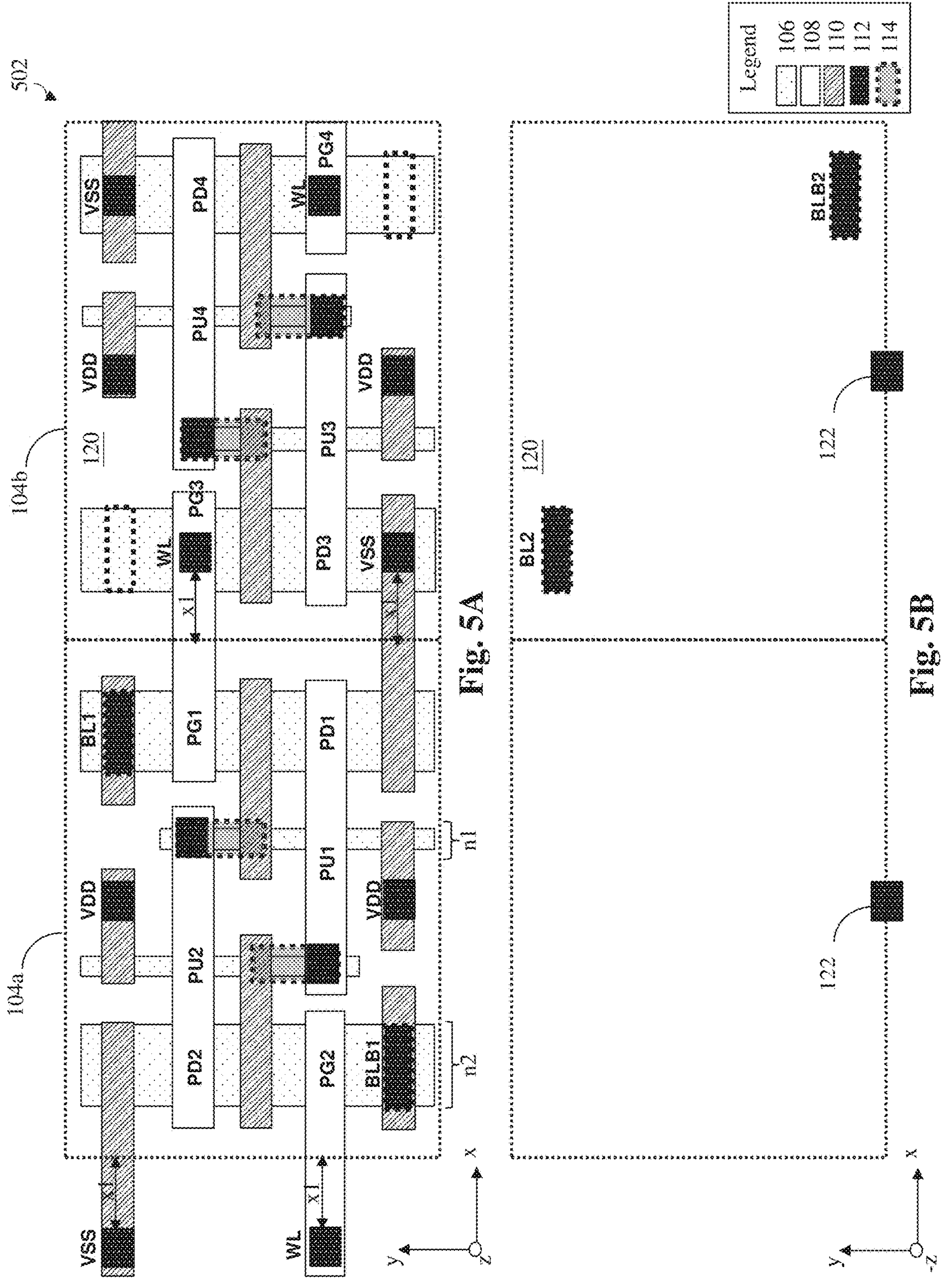
FIGS. 5A and 5B illustrates another device layout of the SRAM array in FIG. 1 according to an embodiment of the present disclosure.

FIGS. 5A and 5B illustrates another device layout 502 of the SRAM array 102 in FIG. 1 according to an embodiment of the present disclosure. The device layout 502 is similar to the device layout 402, and the description of similar features will not be repeated here for the sake of brevity. In device layout 502, a feedthrough (backside) via 122 as part of VDD is also located on the back side of the semiconductor device 100 (or on a back side of the substrate 120). The feedthrough via is a conductive plug that penetrates along the z direction a total height of the substrate 120, thereby making electrical connection between metal lines on the front side and on the backs side of the substrate. In one embodiment, the feedthrough backside via 122 is at a cell boundary edge, such as that of the SRAM cells 104*a* and 104*b*.

Figures 6A, 6B:
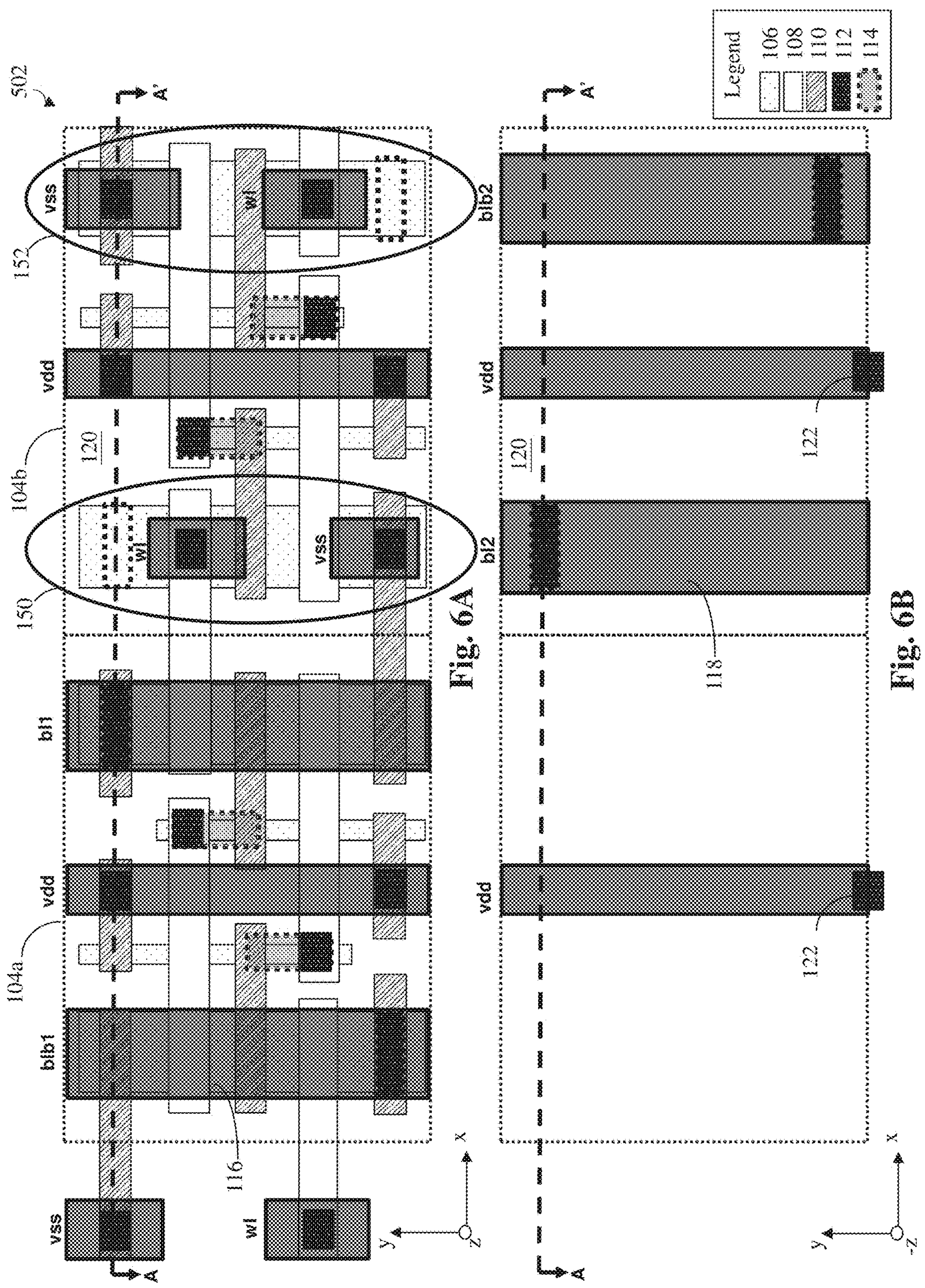
FIGS. 6A and 6B illustrates a device layout showing frontside and backside metal lines of the SRAM array in FIG. 1 according to an embodiment of the present disclosure.

FIGS. 6A and 6B illustrates further structures of the device layout 502. For example, FIGS. 6A and 6B show several frontside and backside metal lines according to an embodiment of the present disclosure. FIG. 6A shows the frontside metal lines 116 on the front side of the substrate 120, and FIG. 6B shows backside metal lines 118 on a back side of the substrate 120. Each of the frontside and backside metal lines 116 and 118 extends lengthwise along the y direction in parallel with the active regions 106. The frontside metal lines 116 are disposed above the device layout 502 in a positive z direction and the backside metal lines 118 are disposed below the device layout 502 in a negative z direction. The frontside metal lines 116 include vss, vdd, wl, bl1, blb1, bl2, and blb2 metal lines. These metal lines are coupled to their corresponding vias 112 for the nodes VSS, VDD, WL, BL1, and BLB1, respectively. Some of the frontside metal lines 116 may couple to multiple vias 112 for the same node (e.g., VDD), and some of the frontside metal lines 116 have multiple metal lines in a single SRAM cell for the same node (e.g., VSS and WL). The backside metal lines 118 include vdd, bl2, and blb2 metal lines. These metal lines are coupled to their corresponding backside vias 112 or feedthrough via 122 for the nodes BL2, and BLB2, and VDD respectively.

Still referring to FIGS. 6A and 6B, the bl1 and blb1 metal lines are the first metal layer bit line and bit line bars of SRAM cell 104*a*, and the bl2 and blb2 metal lines are the first metal layer bit line and bit line bar of SRAM cell 104*b*. As shown, the bit line and bit line bars within each respective SRAM cells 104*a* and 104*b* are on the same side and do not alternate within the same cell (e.g., both on the front side or both on the back side). But the bit line and bit line bars of an adjacent SRAM cell are alternated from one SRAM cell to the next SRAM cell (e.g., from SRAM cell 104*a* to SRAM cell 104*b*). That is, the alternating configuration is cell by cell and not within one cell. This alternating configuration reduces coupling capacitance between bit lines and/or bit line bars of adjacent SRAM cells because the bit lines and/or bit line bars would not be on the same side from cell to cell.

Still referring to FIGS. 6A and 6B, a wl metal line and a vss metal line form a first pair of offset metal lines 150 another wl metal line and another vss metal line form a second pair of offset metal lines 152. Each of the first pair 150 and the second pair 152 are disposed within the SRAM cell 104*b* at a distance away from the vertical cell boundaries. In one embodiment, the first pair of offset metal lines 150 completely or substantially overlap with the bl2 metal line from a top view (along the z direction). That is, the bl2 metal line may completely or substantially cover the first pair of offset metal lines 150 when viewed from a bottom view (along the negative z direction). Similarly, the second pair of offset metal lines 152 completely or substantially overlap with the blb2 metal line from a top view (along the z direction). That is, the blb2 metal line may completely or substantially cover the second pair of offset metal lines 152 (along the negative z direction). In another embodiment, even if there is no substantial overlap, at least a portion of each of the bl2 and blb2 metal lines overlap with a portion of each of the first and second pair of offset metal lines 150 and 152, respectively. In other words, along the z direction, there is a portion of the active regions 106 that is directly sandwiched between the bl2 metal line and the first pair of offset metal lines 150, and there is another portion of the active regions 106 that is directly sandwiched between the blb2 metal line and the second pair of offset metal lines 152. Further, the wl metal line and the vss metal line of the first pair of offset metal lines 150 may be aligned or at least overlap with each other along the y direction. And the wl metal line and the vss metal line of the second pair of offset metal lines may be aligned or at least overlap with each other along the y direction.

Still referring to FIGS. 6A and 6B, there are vdd metal lines disposed within the SRAM cells 104*a* and 104*b*. These vdd metal lines are voltage power lines that connect to the VDD node. In an embodiment, the vdd metal lines are disposed on the front side of the substrate 120. For example, the vdd metal line for the SRAM cell 104*a* is disposed at the same metal layer as the blb1 and bl1 metal lines; it is also disposed in between the blb1 and bl1 metal lines. The vdd metal line for SRAM cell 104*b* is disposed at the same metal layer as the first and second pairs of offset metal lines 150 and 152; it is also disposed in between the first and second pairs of offset metal lines 150 and 152. In another embodiment, additional vdd metal lines are disposed on the back side of the substrate 120. These additional backside vdd metal lines may allow for easier biasing of input voltage to pull up the device to high voltage. For example, the redundancy of vdd metal lines is possible because of electrical connections to both a front side and a back side of a source feature for a pull-up transistor (e.g., S/D epitaxial features 708 in FIG. 7). Along the y direction, each of the backside vdd metal lines may be substantially aligned with respective vdd metal lines on the front side of the substrate. As such, there may be an overlap between the backside vdd metal lines and the vdd metal lines on the front side of the substrate when viewed along the z direction. The vdd metal lines are in a center portion within each respective SRAM cells 104*a* and 104*b* when viewed along the x direction.

Figure 7:
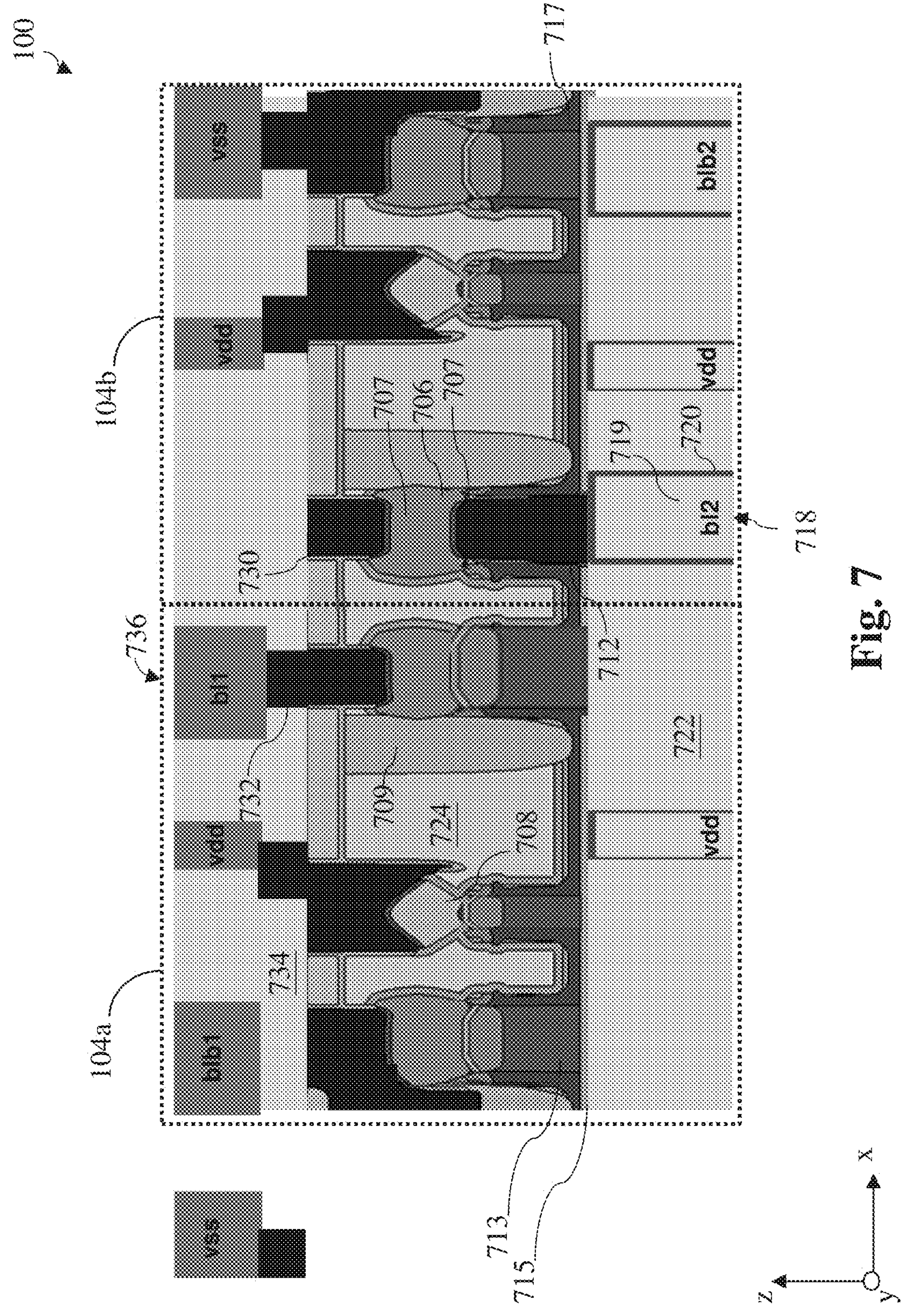
FIG. 7 illustrates a cross-sectional view of a semiconductor device having an SRAM array cut along the lines A-A' in FIGS. 6A and 6B.

FIG. 7 illustrates a cross-sectional view of a semiconductor device 100 having an SRAM array 102 cut along the lines A-A' of the device layout 502 in FIGS. 6A and 6B. The A-A' line cuts through several frontside metal lines 736 and backside metal lines 718 and through corresponding frontside and backside vias 732 and 712. The frontside metal lines 736 correspond to the frontside metal lines 116, shown by the labeled metal lines that the A-A' line cuts through (e.g., the vss, vdd, blb1, and bl1 metal lines). The backside metal lines 718 correspond to the backside metal lines 118, shown by the labeled metal lines that the A-A' line cuts through (e.g., the vdd, bl2, and blb2 metal lines).

In an embodiment, the backside metal lines 718 may include a barrier layer 720 and a metal fill layer 719 over the barrier layer 720. The barrier layer 720 may include titanium (Ti), tantalum (Ta), or a conductive nitride such as titanium nitride (TiN), titanium aluminum nitride (TiAlN), tungsten nitride (WN), tantalum nitride (TaN), or combinations thereof, and may be formed by CVD, PVD, ALD, and/or other suitable processes. The metal fill layer 719 may include copper (Cu), tungsten (W), cobalt (Co), molybdenum (Mo), ruthenium (Ru), or other metals, and may be formed by CVD, PVD, ALD, plating, or other suitable processes. In some embodiments, the barrier layer 720 is omitted in backside metal lines 718. Although not shown, the frontside metal lines 736 may also include a barrier layer 720 and a metal fill layer 719 over the barrier layer 720.

In an embodiment, the backside metal lines 718 may have different dimensions than the frontside metal lines 116. For example, the backside metal lines 718 may be thicker in the z direction and narrower in the x direction when compared to frontside metal lines 116. For design purposes, for example, some of the backside metal lines 718 may be twice as thick as the frontside metal lines 116, but those frontside metal lines may be twice as wide as the backside metal lines, so that performance parameters may be balanced and tuned as necessary.

The frontside metal lines 736 may couple to frontside vias 732, which may then couple to source/drain (S/D) contact features 730 on a front side of the device 100. The S/D contact features 730 directly couples to an S/D epitaxial feature 706 or 708. The backside metal lines 718 may couple to backside vias 712, which directly couples to an S/D epitaxial feature 706 or 708. In an embodiment, to couple frontside metal lines 736 to an S/D epitaxial feature 706 or 708, there is two manufacturing steps: one to form the S/D contact features 730 and one to form the vias 732 over the S/D contact features 730. On the other hand, to couple backside metal lines 718 to an S/D epitaxial feature 706 or 708, there may be only one manufacturing step: to form the backside vias 712 to directly contact the S/D epitaxial features 706 or 708 from the back side.

In an embodiment, the S/D epitaxial features 706 are doped with n-type dopants for n-type transistors. In some embodiments, the S/D epitaxial features 706 include silicon and can be doped with carbon, phosphorous, arsenic, other n-type dopant, or combinations thereof (for example, forming Si:C epitaxial source/drain features, Si:P epitaxial source/drain features, or Si:C:P epitaxial source/drain features). Further, in some embodiments, there may be silicide features 707 disposed over and under the S/D epitaxial features 706. For example, the silicide features 707 may be disposed between the S/D epitaxial features 706 and the backside vias 712. The silicide features 707 may also be disposed between the S/D epitaxial features 706 and the conductive features 730. The silicide features 707 may include titanium silicide (TiSi), nickel silicide (NiSi), tungsten silicide (WSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), or other suitable compounds.

As shown, the device 100 also includes S/D epitaxial features 708. In an embodiment, the S/D epitaxial features 708 are doped with p-type dopants for p-type transistors. In some embodiments, for p-type transistors, the S/D epitaxial features 708 include silicon germanium or germanium and can be doped with boron, other p-type dopant, or combinations thereof (for example, forming Si:Ge:B epitaxial source/drain features). Further, in some embodiments, there may be silicide features 707 disposed over and under the S/D epitaxial features 708. For example, the silicide features 707 may be disposed between the S/D epitaxial features 708 and the backside vias 712. The silicide features 707 may also be disposed between the S/D epitaxial features 708 and the conductive features 730. The S/D epitaxial features 706 and 708 are isolated from each other by an interlayer dielectric (ILD) layer 724. In some embodiments, the ILD layer may embed a shallow trench isolation layer (STI) at a bottom portion of the ILD layer (not shown).

The frontside metal lines 736 are separated from each other by a frontside dielectric layer 734, and the backside metal lines 718 are separated from each other by a backside dielectric layer 722. The frontside dielectric layer 734, the backside dielectric layer 722, and the ILD layer 724 may each comprise oxide formed with tetraethylorthosilicate, un-doped silicate glass, or doped silicon oxide such as borophosphosilicate glass (BPSG), fluoride-doped silica glass (FSG), phosphosilicate glass (PSG), boron doped silicon glass (BSG), a low-k dielectric material, other suitable dielectric material, or combinations thereof. For the S/D epitaxial features 706 and S/D epitaxial features 708 that do not couple to a backside via 712, an insulating layer 713 is disposed over them on the backside, which then contacts a contact etch stop layer (CESL) 715. The CESL 715 includes a material that is different than the backside dielectric layer 722 and different than the insulating layer 713. The CESL 715 may include La2O3, Al2O3, SiOCN, SiOC, SiCN, SiO2, SiC, ZnO, ZrN, Zr2Al3O9, TiO2, TaO2, ZrO2, HfO2, Si3N4, Y2O3, AlON, TaCN, ZrSi, or other suitable material(s); and may be formed by CVD, PVD, ALD, or other suitable methods. The insulating layer 713 may include materials similar to that of the front and backside dielectric layers 734 and 722. In some embodiments, there may be a dielectric liner 717 that lines the sidewalls of the backside vias 712 and the insulating layer 713. In some embodiments, cut metal gate features 709 may be disposed within the ILD layer 724. The cut metal gate features 709 may separately isolate gate structures in the semiconductor device 100 by cutting them along the y direction.

Still referring to FIG. 7, certain metal lines from the front side of the device 100 may overlap with certain metal lines from the back side of the device 100 along the z direction (i.e., a portion of the metal lines mirror each other across features between them). For example, the frontside and backside vdd metal lines may mirror each other across the S/D epitaxial feature 708 that they are electrically coupled to. In this cross section, the backside vdd metal lines are not shown to couple to the S/D epitaxial features connected to the frontside vdd metal lines. However, in another cross section, such coupling is made through the feedthrough via 122. Further, metal lines may mirror each other across a S/D epitaxial feature even when only one of the metal lines is coupled to it. For example, as shown in the SRAM cell **104*b*, the vss metal line mirrors the blb2 metal line across a S/D feature 706, but only the vss metal line couples to the S/D feature 706 while the blb2 metal line is insulated from the S/D feature 706 by the etch stop layer 715 and the insulating layer 713**.

Figure 8:
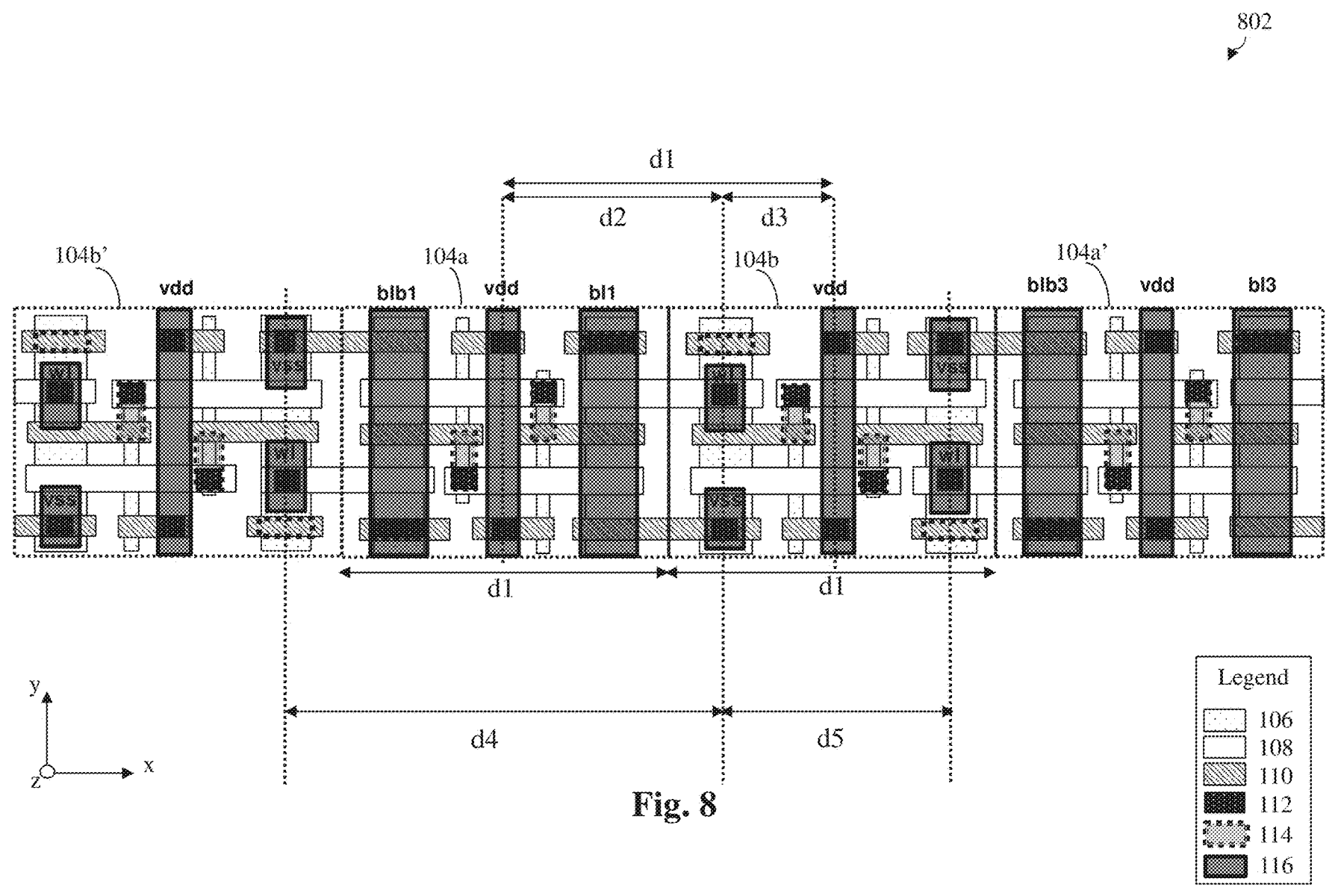

FIG. 8 illustrates a device layout 802 showing frontside metal lines 116 of a semiconductor device 100 having an SRAM array. The SRAM array includes four SRAM cells **104*a*, 104*b*, 104*a*', and 104*b*'. These SRAM cells and their respective device regions are defined by the dashed line cell boundaries. The device layout 802 is similar to the device layout 502 as shown in FIG. 6A, except that the additional adjacent SRAM cells 104*a*' and 104*b*' are shown. SRAM cell 104*a*' has the same structure and layout as SRAM cell 104*a*, and SRAM cell 104*b*' has the same structure and layout as SRAM cell 104*b*. Therefore, along the x direction, the cell layout and structure from cell to cell alternates between 104*a* type and a 104*b* type SRAM cells. As shown, only bit lines and bit line bars of the 104*a* type SRAM cells are disposed on the front side of the device 100. These are the bl1, blb1, bl3, and blb3 frontside metal lines. Further, all the wl and vss metal lines are within the 104*b* type SRAM cells and not within the 104*a* type SRAM cells. For the 104*a* type SRAM cells, the vdd metal lines are disposed in between metal lines for bit lines and bit line bars. And for the 104*b*** type SRAM cells, the vdd metal lines are disposed between metal lines for word lines and/or ground lines (vss).

Still referring to FIG. 8, each of the SRAM cells may be of the same size. In an embodiment, each of the SRAM cells 104*a* and 104*b* have a width d1 along the x direction. The vdd metal lines are substantially in the middle of each of the SRAM cells 104*a* and 104*b* along the x direction. The distance between the vdd metal lines from one SRAM cell to the next may be equal to the width d1. As shown, a vss metal line and a wl metal line may be disposed between adjacent first and second vdd metal lines in SRAM cells 104*a* and 104*b*, respectively. The distance between the first vdd metal line and the vss metal line is d2, and the distance between the vss metal line and the second vdd metal line is d3, where d2 is not equal to d3. Similarly, the distance between the first vdd metal line and the wl metal line is d2, and the distance between the wl metal line and the second vdd metal line is d3. The distance d2 plus d3 may equal d1. Further, the distance between adjacent vss metal lines and adjacent wl metal lines may vary along the SRAM array. As shown, d4 is a distance between adjacent vss or wl metal lines within different SRAM cells, and d3 is a distance between adjacent vss or wl metal lines within the same SRAM cell. As such, the distance d4 is greater than d1, and the distance d1 is greater than d5.

Figures 9A, 9B:
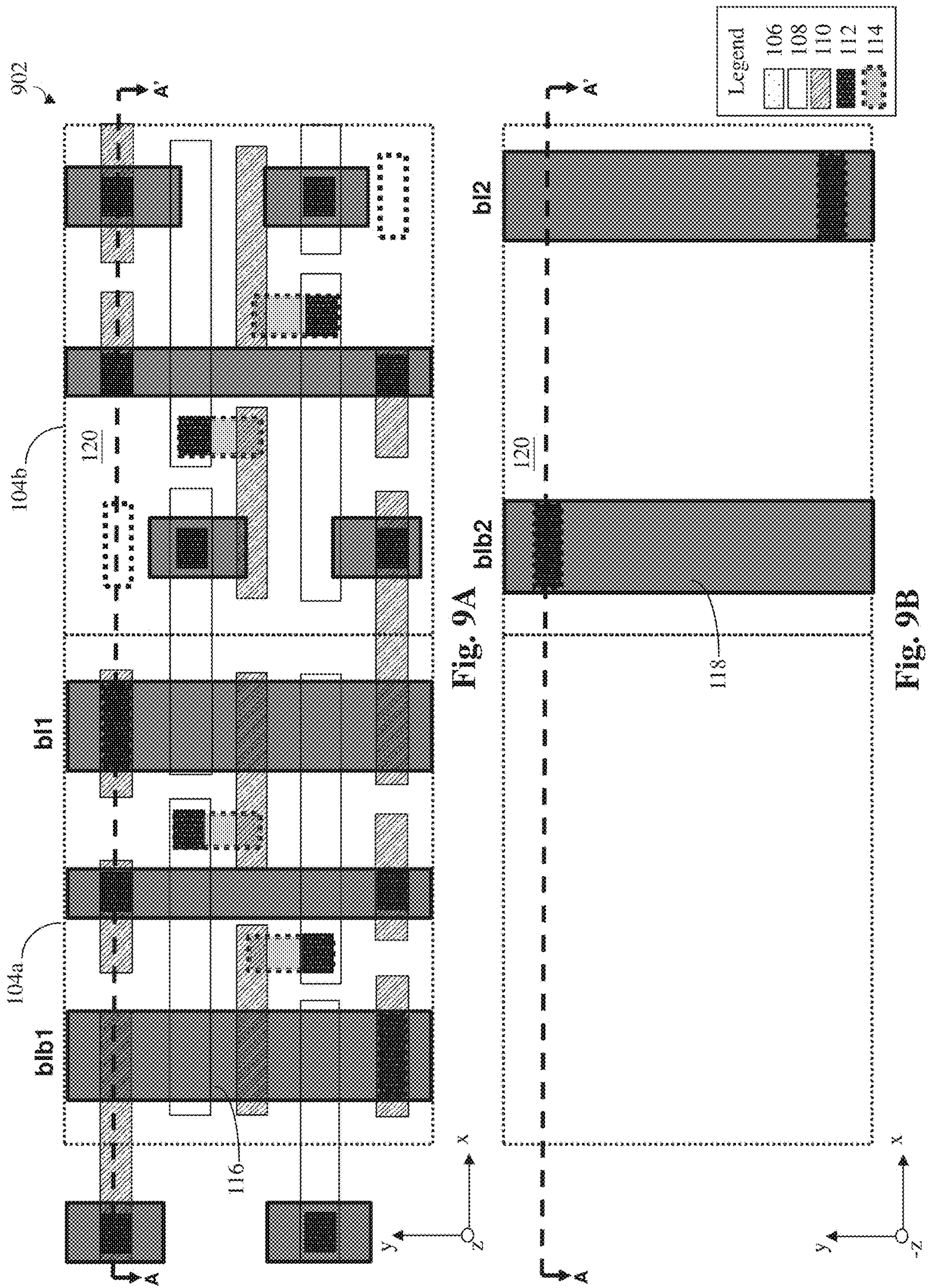
FIGS. 9A and 9B illustrates another embodiment of a device layout showing frontside and backside metal lines of the SRAM array in FIG. 1.

FIGS. 9A and 9B illustrates another embodiment of a device layout 902 showing frontside and backside metal lines. The device layout 902 is similar to the device layout 502, and the similar features will not be recited again for the sake of brevity. In the device layout 902, the location of the bl2 and blb2 metal lines are swapped as compared to the device layout 502.

Figures 10A, 10B:
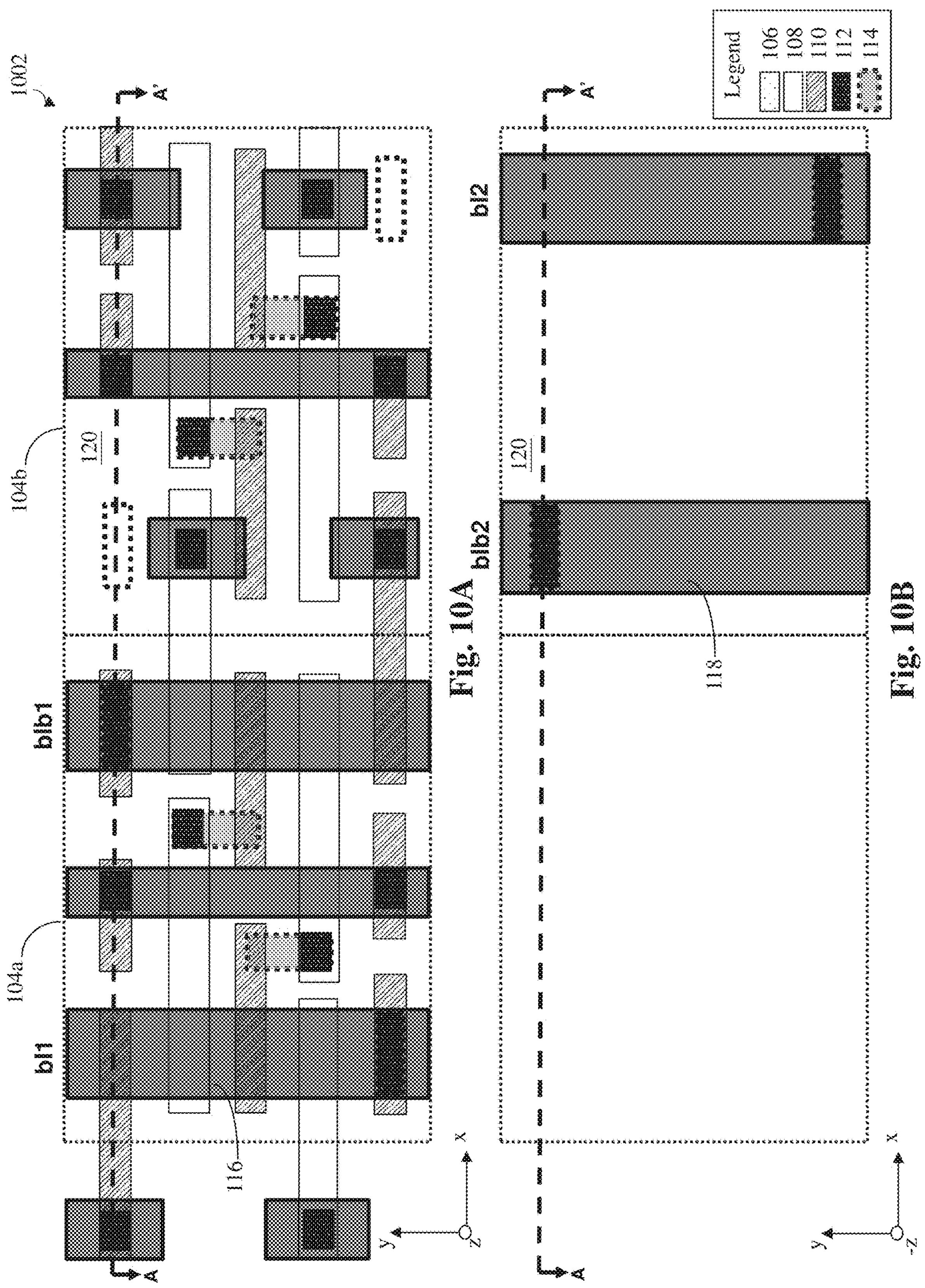
FIGS. 10A and 10B illustrates another embodiment of a device layout showing frontside and backside metal lines of the SRAM array in FIG. 1.

FIGS. 10A and 10B illustrates another embodiment of a device layout 1002 showing frontside and backside metal lines. The device layout 1002 is similar to the device layout 502, and the similar features will not be recited again for the sake of brevity. In the device layout 1002, as compared to the device layout 502, the location of the bl1 and blb1 metal lines are swapped, and the location of the bl2 and blb2 metal lines are swapped.

Figures 11A, 11B:
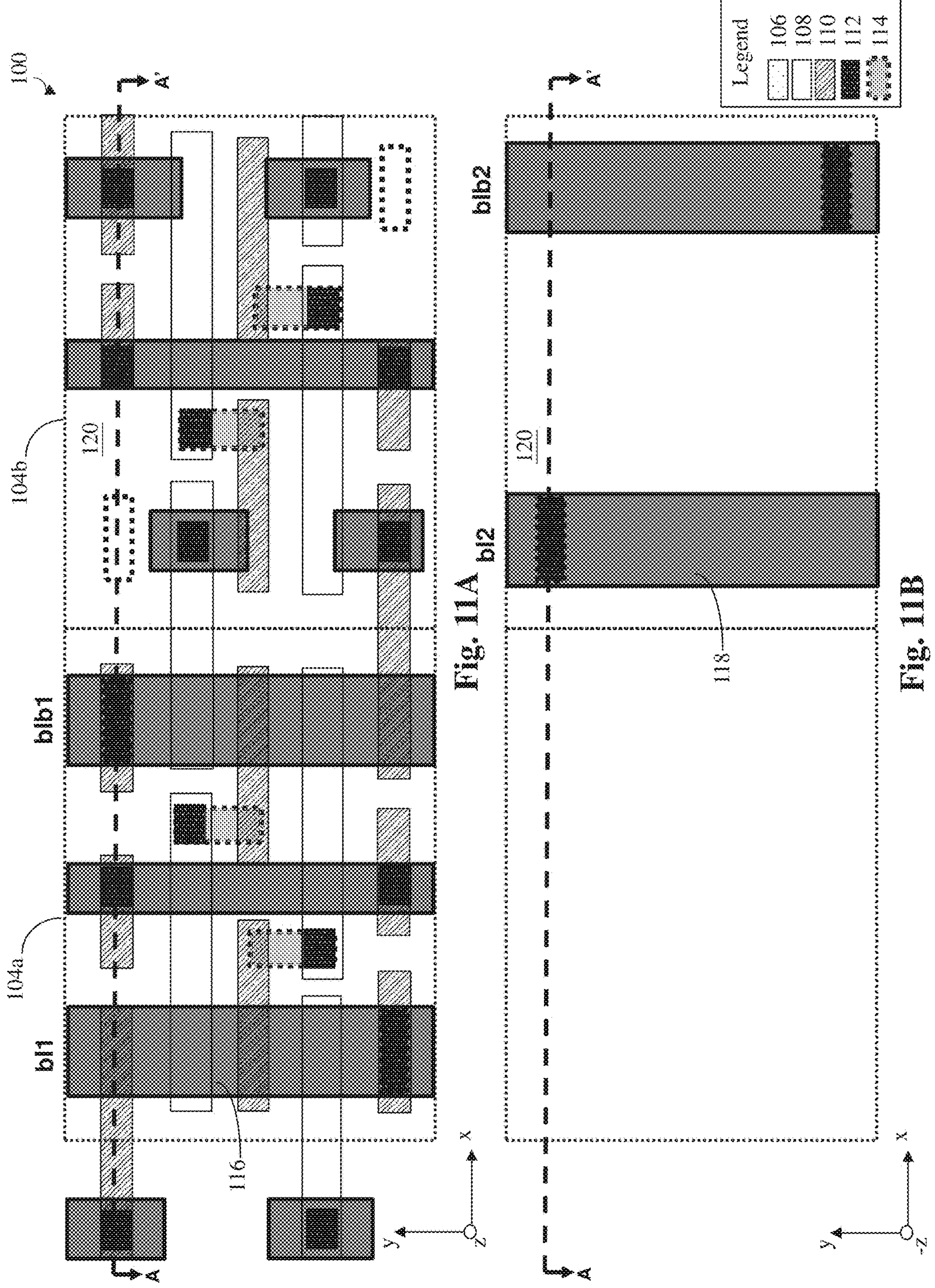
FIGS. 11A and 11B illustrates another embodiment of a device layout showing frontside and backside metal lines of the SRAM array in FIG. 1.

FIGS. 11A and 11B illustrates another embodiment of a device layout 1102 showing frontside and backside metal lines. The device layout 1102 is similar to the device layout 502, and the similar features will not be recited again for the sake of brevity. In the device layout 1102, as compared to the device layout 502, the location of the bl1 and blb1 metal lines are swapped.

Although not limiting, the present disclosure offers advantages for semiconductor devices having embedded SRAM. One example advantage is that the location of metal lines for bit lines and bit line bars are alternated from cell to cell, thereby reducing coupling capacitance between signal lines. The alternating configuration is from cell to cell and not within the same SRAM cell. This allows for better cell metal symmetry and SRAM read/hold margin balance. Another example advantage is metal lines for word lines and ground lines have increased offset from the metal lines for the bit lines and bit line bars. This offset is possible due to the extra spacing created by moving some of the bit lines and bit line bars onto the backside of the device. This allows frontside metal lines to be further spaced apart to further reduce unwanted coupling and also to allow for more relaxed processing margins when manufacturing the device.

One aspect of the present disclosure pertains to a memory device. The device includes a substrate having a first region and a second region adjacent the first region. A first SRAM cell is disposed within the first region, the first SRAM cell having first active regions extending lengthwise along a first direction on the substrate. A second SRAM cell is disposed within the second region, the second SRAM cell having second active regions extending lengthwise along the first direction on the substrate. Frontside metal lines are disposed over the first and second active regions, the frontside metal lines having a first bit line and a first bit line bar within the first region. And backside metal lines are under the first and second active regions, the backside metal lines having a second bit line and a second bit line bar within the second region.

In an embodiment, the frontside metal lines further include a first word line and a first ground line within the second region such that the first word line overlaps with the second bit line along a vertical direction from a top view, and the first ground line also overlaps with the second bit line along the vertical direction.

In an embodiment, the frontside metal lines further include a second word line and a second ground line within the second region such that the second word line overlaps with the second bit line bar along the vertical direction, and the second ground line also overlaps with the second bit line bar along the vertical direction.

In an embodiment, the first word line is electrically connected to a shared gate that extends across from the first region to the second region along a second direction perpendicular to the first direction. In another embodiment, the first ground line is electrically connected to a shared source/drain (S/D) contact that extends across from the first region to the second region along the second direction. Further, in yet another embodiment, the shared gate functions as a gate electrode of a pass-gate transistor of the first SRAM cell and a pass-gate transistor of the second SRAM cell, and the shared S/D contact is electrically connected to an S/D feature of a pull-down transistor of the first SRAM cell and an S/D feature of a pull-down transistor of the second SRAM cell.

In an embodiment, the frontside metal lines further includes a first power line within the first region and a second power line within the second region. In another embodiment, the backside metal lines further include a third power line within the first region and a fourth power line within the second region, wherein the first and third power lines are electrically connected to a source of a pull-up transistor of the first SRAM cell and the second and fourth power lines are electrically connected to a source of a pull-up transistor of the second SRAM cell. In another embodiment, the first and third power lines are disposed between the first bit line and the first bit line bar and the second and fourth power lines are disposed between the second bit line and the second bit line bar.

In an embodiment, the device further includes a first via that electrically connects the shared gate to the first word line, and a second via that electrically connects the shared S/D contact to the first ground line, where the first via and the second via are disposed within the second region. In another embodiment, the first and the second vias overlap with the second bit line along the vertical direction.

Another aspect of the present disclosure pertains to a memory device. The device includes a substrate having a first region and a second region. A first SRAM cell is disposed within the first region, the first SRAM cell having first active regions extending lengthwise along a first direction on the substrate. A second SRAM cell is adjacent to the first SRAM cell and disposed within the second region, the second SRAM cell having second active regions extending lengthwise along the first direction on the substrate. Frontside metal lines are over the first and second active regions, the frontside metal lines having a first bit line and a first bit line bar within the first region. Backside metal lines are under the first and second active regions, the backside metal lines having a second bit line and a second bit line bar within the second region. And word lines and ground lines are within the second region such that each of the word lines and the ground lines overlaps with one of the second bit line and second bit line bar along a vertical direction from a top view.

In an embodiment, the device further includes a shared gate that extends across from the first region to the second region and engaging a channel of one of the first active regions and a channel of one of the second active regions. The device further includes a word line via directly connected to the shared gate, the word line via coupling the shared gate directly to one of the word lines, where the word line via is disposed within the second region.

In an embodiment, the device further includes a shared metal contact that extends across from the first region to the second region and directly coupled to a source of one of the first active regions and a source of one of the second active regions. The device further includes a ground line via directly connected to the shared metal contact, the ground line via coupling the shared metal contact directly to one of the ground lines, where the ground line via is disposed within the second region.

In an embodiment, the device further includes a first power line within the first region and on a front side of the substrate, the first power line disposed between the first bit line and the first bit line bar, and a second power line within the second region and on the front side of the substrate, the second power line disposed between word lines and between ground lines. In another embodiment, the device further includes a third power line within the first region on a back side of the substrate, the third power line overlapping the first power line along the vertical direction and a fourth power line within the second region on the back side of the substrate, the fourth power line overlapping the second power line along the vertical direction.

In an embodiment, the second bit line and the second bit line bar have a greater thickness than the first bit line and the first bit line bar. And in another embodiment, the third and the fourth power line have a greater thickness than the first and the second power lines.

Another aspect of the present disclosure pertains to a memory device. The device includes a substrate having a front side and a back side. The device includes a first SRAM cell having first active regions extending lengthwise along a first direction on the front side of the substrate. The device includes a second SRAM cell adjacent to the first SRAM cell, the second SRAM cell having second active regions extending lengthwise along the first direction on the front side of the substrate. The device includes a first bit line and a first bit line bar of the first SRAM cell disposed on the front side of the substrate and electrically connected to one of the first active regions and a second bit line and a second bit line bar of the second SRAM cell disposed on the back side of the substrate and electrically connected to one of the second active regions. The device includes a first power line in the first SRAM cell, a second power line in the second SRAM cell, and a ground line in the second SRAM cell and electrically connected to one of the second active regions, where the ground line is disposed between the first and the second power lines, and a distance between the first power line and the ground line is greater than a distance between the second power line and the ground line.

In an embodiment, the device further includes a gate structure over the one of the second active regions and a word line in the second SRAM cell and coupled to the gate structure, where the word line is disposed between the first and the second power lines, and a distance between the first power line and the word line is greater than a distance between the second power line and the word line.

In another embodiment, the device further includes a ground line via coupled between the one of the second active regions and the ground line and a word line via coupled between the one of the second active regions and the gate structure, where the ground line via and the word line via are directly over the one of the second active regions.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A static random access memory (SRAM) device, comprising:
- a substrate having a first region and a second region adjacent the first region;
- a first SRAM cell disposed within the first region, the first SRAM cell having first active regions extending lengthwise along a first direction on the substrate;
- a second SRAM cell disposed within the second region, the second SRAM cell having second active regions extending lengthwise along the first direction on the substrate;
- frontside metal lines over the first and second active regions, the frontside metal lines having a first bit line and a first bit line bar within the first region, wherein the frontside metal lines further include a first power line within the first region and a second power line within the second region; and
- backside metal lines under the first and second active regions, the backside metal lines having a second bit line and a second bit line bar within the second region.

2. The SRAM device of claim 1, wherein the frontside metal lines further include a first word line and a first ground line within the second region such that the first word line overlaps with the second bit line along a vertical direction from a top view, and the first ground line also overlaps with the second bit line along the vertical direction.

3. The SRAM device of claim 2, wherein the frontside metal lines further include a second word line and a second ground line within the second region such that the second word line overlaps with the second bit line bar along the vertical direction, and the second ground line also overlaps with the second bit line bar along the vertical direction.

4. The SRAM device of claim 2, wherein the first word line is electrically connected to a shared gate that extends across from the first region to the second region along a second direction perpendicular to the first direction.

5. The SRAM device of claim 4, wherein the first ground line is electrically connected to a shared source/drain (S/D) contact that extends across from the first region to the second region along the second direction.

6. The SRAM device of claim 5, wherein the shared gate functions as a gate electrode of a pass-gate transistor of the first SRAM cell and a pass-gate transistor of the second SRAM cell, and the shared S/D contact is electrically connected to an S/D feature of a pull-down transistor of the first SRAM cell and an S/D feature of a pull-down transistor of the second SRAM cell.

7. The SRAM device of claim 5, further comprising:

a first via that electrically connects the shared gate to the first word line; and a second via that electrically connects the shared S/D contact to the first ground line, wherein the first via and the second via are disposed within the second region.

8. The SRAM device of claim 7, wherein the first and the second vias overlap with the second bit line along the vertical direction.

9. The SRAM device of claim 1, wherein the backside metal lines further include a third power line within the first region and a fourth power line within the second region, wherein the first and third power lines are electrically connected to a source of a pull-up transistor of the first SRAM cell and the second and fourth power lines are electrically connected to a source of a pull-up transistor of the second SRAM cell.

10. The SRAM device of claim 9, wherein the first and third power lines are disposed between the first bit line and the first bit line bar and the second and fourth power lines are disposed between the second bit line and the second bit line bar.

11. The SRAM device of claim 1, wherein the frontside metal lines further include:

a first word line and a first ground line overlapping with the second bit line along a vertical direction from a top view; and a second word line and a second ground line overlapping with the second bit line bar along the vertical direction.

12. A static random access memory (SRAM) device, comprising:

a substrate having a first region and a second region;

a first SRAM cell disposed within the first region, the first SRAM cell having first active regions extending lengthwise along a first direction on the substrate;

a second SRAM cell adjacent to the first SRAM cell and disposed within the second region, the second SRAM cell having second active regions extending lengthwise along the first direction on the substrate;

frontside metal lines over the first and second active regions, the frontside metal lines having a first bit line and a first bit line bar within the first region;

backside metal lines under the first and second active regions, the backside metal lines having a second bit line and a second bit line bar within the second region; and multiple word lines and multiple ground lines selectively within the second region but not within the first region such that each of the multiple word lines and the ground lines overlaps with one of the second bit line and second bit line bar in the second region along a vertical direction from a top view.

13. The SRAM device of claim 12, further comprising:

a shared gate that extends across from the first region to the second region and engaging a channel of one of the first active regions and a channel of one of the second active regions; and a word line via directly connected to the shared gate, the word line via coupling the shared gate directly to one of the word lines, wherein the word line via is disposed within the second region.

14. The SRAM device of claim 12, further comprising:

a shared metal contact that extends across from the first region to the second region and directly coupled to a source of one of the first active regions and a source of one of the second active regions; and a ground line via directly connected to the shared metal contact, the ground line via coupling the shared metal contact directly to one of the ground lines, wherein the ground line via is disposed within the second region.

15. The SRAM device of claim 12, further comprising:

a first power line within the first region and on a front side of the substrate, the first power line disposed between the first bit line and the first bit line bar; and a second power line within the second region and on the front side of the substrate, the second power line disposed between word lines and between ground lines.

16. The SRAM device of claim 15, further comprising:

a third power line within the first region on a back side of the substrate, the third power line overlapping the first power line along the vertical direction; and a fourth power line within the second region on the back side of the substrate, the fourth power line overlapping the second power line along the vertical direction.

17. The SRAM device of claim 16, wherein the second bit line and the second bit line bar have a greater thickness than the first bit line and the first bit line bar, and the third and the fourth power line have a greater thickness than the first and the second power lines.

18. A static random access memory (SRAM) device, comprising:

a substrate having a front side and a back side;

a first SRAM cell having first active regions extending lengthwise along a first direction on the front side of the substrate;

a second SRAM cell adjacent to the first SRAM cell, the second SRAM cell having second active regions extending lengthwise along the first direction on the front side of the substrate;

a first bit line and a first bit line bar of the first SRAM cell disposed on the front side of the substrate and each electrically connected to one of the first active regions;

a second bit line and a second bit line bar of the second SRAM cell disposed on the back side of the substrate and each electrically connected to one of the second active regions;

a first power line in the first SRAM cell;

a second power line in the second SRAM cell; and a ground line in the second SRAM cell and electrically connected to one of the first active regions and one of the second active regions from a frontside of the respective first and second active regions, wherein the ground line is disposed between the first and the second power lines, and a distance between the first power line and the ground line is greater than a distance between the second power line and the ground line.

19. The SRAM device of claim 18, further comprising:

a gate structure over the one of the second active regions; and a word line in the second SRAM cell and coupled to the gate structure, wherein the word line is disposed between the first and the second power lines, and a distance between the first power line and the word line is greater than a distance between the second power line and the word line.

20. The SRAM device of claim 19, further comprising:

a ground line via coupled between the one of the second active regions and the ground line; and a word line via coupled between the one of the second active regions and the gate structure, wherein the ground line via and the word line via are directly over the one of the second active regions.

* * * * *